United States Patent
Ogawa et al.

[11] Patent Number: 5,153,845
[45] Date of Patent: Oct. 6, 1992

[54] TIME BASE CONVERSION CIRCUIT

[75] Inventors: Yoshihiko Ogawa; Seijiro Yasuki; Kiyoyuki Kawai, all of Kanagawa, Japan

[73] Assignee: Kabushiki Kaisha Toshiba, Kanagawa, Japan

[21] Appl. No.: 612,973

[22] Filed: Nov. 15, 1990

[30] Foreign Application Priority Data

Nov. 16, 1989 [JP] Japan .................. 1-296271

[51] Int. Cl.$^5$ ............................. G06F 15/31
[52] U.S. Cl. .................. 364/715.02; 364/710.1; 358/160
[58] Field of Search ......... 364/715.02, 710.1; 381/34; 358/160; 370/109

[56] References Cited

U.S. PATENT DOCUMENTS

| 4,435,832 | 3/1984 | Adada et al. | 381/34 |
| 4,623,922 | 11/1986 | Wischermann | 358/160 |
| 4,748,578 | 5/1988 | Lagadec et al. | 364/724.1 |
| 4,862,271 | 8/1989 | Smith et al. | 364/714.1 |
| 5,023,825 | 6/1991 | Luthra et al. | 364/714.1 |
| 5,029,006 | 7/1991 | Katsumata et al. | 358/160 |

FOREIGN PATENT DOCUMENTS

| 0133026 | 2/1985 | European Pat. Off. |
| 0183201 | 6/1986 | European Pat. Off. |
| 59-61371 | 4/1984 | Japan |

OTHER PUBLICATIONS

"Effets Speciaux: Chagement de Format d'une Image de Television" Toute L'Electronique No. 460, Jan. 1981, pp. 23–28.

Primary Examiner—David H. Malzahn
Attorney, Agent, or Firm—Finnegan, Henderson Farabow, Garrett and Dunner

[57] ABSTRACT

A time base conversion circuit including a data interpolating circuit for converting a digital signal of sampling frequency fs into a digital signal having M (M is a positive integer) samples per N/fs (N is another positive integer) cycle without loosing data during the interpolating process, a register for holding M data which are output from the data interpolating circuit at the cycle of N/fs, M memories for storing M data which are held by the register at the cycle of N/fs, and controller for controlling data write/read operations of the memories at the cycle of M/fs and a selecter for selecting M data read from the memories by the controller successivly at the cycle of 1/fs.

5 Claims, 6 Drawing Sheets

TIME BASE CONVERSION CIRCUIT

FIELD OF THE INVENTION

The present invention relates generally to a time base conversion circuit, and more particularly, to a time base conversion circuit which compresses or expands a time base of digital signals.

BACKGROUND OF THE INVENTION

For the time base conversion, e.g., time base compression or time base expansion, of digital signals, there is a method to use the interpolation processing. This is a method to convert the time base by changing the sampling cycle after converting the number of samples in advance by the interpolation processing so that the sampling cycle after the time base conversion agrees with that before the time base conversion.

Equipment using this technique is known for example in the U.S. Pat. No. 4,623,922 issued for Gerhard Wischermann.

The equipment described in the U.S. Patent is in such structure that interpolators are provided at the input and output sides of a memory.

In this equipment, the time base expansion is made using the memory and the interpolators at its output side. That is, input digital signals are written in the memory by the continuous first clock. The data written in the memory are read by the second clock. This second clock has the same repetition frequency as that of the first clock and becomes discontinued a clock whose pulses lack a fixed cycle. The data read out of the memory is output as a digital signal whose time base is expanded by the operation of the interpolator at the output side.

On the other hand, the time base compression is made using the memory and the interpolator at provided at the memory's input side. That is, input data are written into the memory according to the second clock after the operation by the interpolator at the input side. The data written in the memory are read according to the first clock. Thus, a digital signal with a compressed time base is obtained.

The operation described above will be explained referring to FIGS. 1A to 1G and FIG. 2 by taking a case to extend the time base by 4/3 times as an example.

FIGS. 1A to 1G are timing charts showing the operation when the time base is extended by 4/3 times. FIG. 2 is a circuit diagram showing the outline of the time base expansion system of the above equipment.

Figures 1A, 1B, 1C:
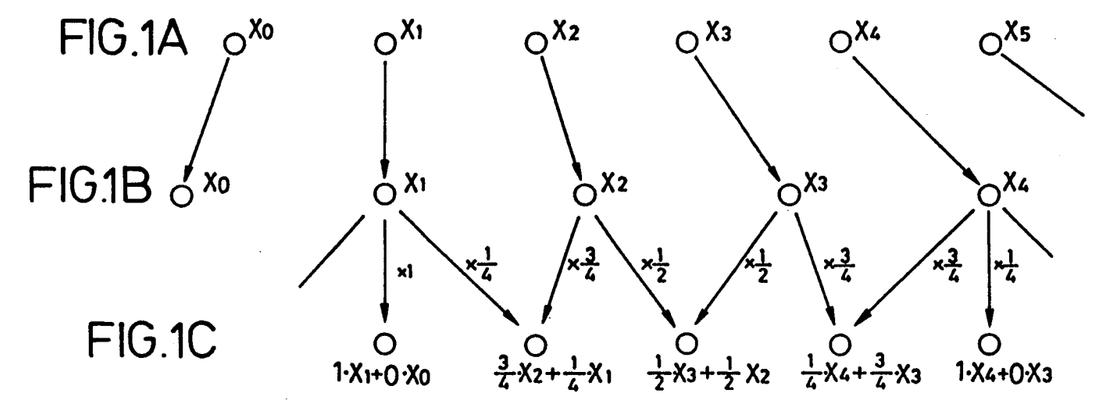
FIGS. 1A to 1G are diagrams for illustrating the conventional time base conversion process of the conventional time base conversion apparatus.

FIG. 1A shows the input digital signal whose time base is to be extended. The sampling clock of this signal is a continuous pulse train as shown in FIG. 1A.

FIG. 1B shows the signal in FIG. 1A after extending the time base by 4/3 times. However, this time base expansion extends the sampling period while keeping the data unchanged and the signal is considered to be a virtual sampling train.

By performing the interpolation shown in FIG. 1C using the signal shown in FIG. 1B, a digital signal which has a sampling period the same as that of the signal shown in FIG. 1A and which has its time base extended by 4/3 times is obtained.

The time base expansion processing described above is explained according to FIG. 2.

Figure 2:
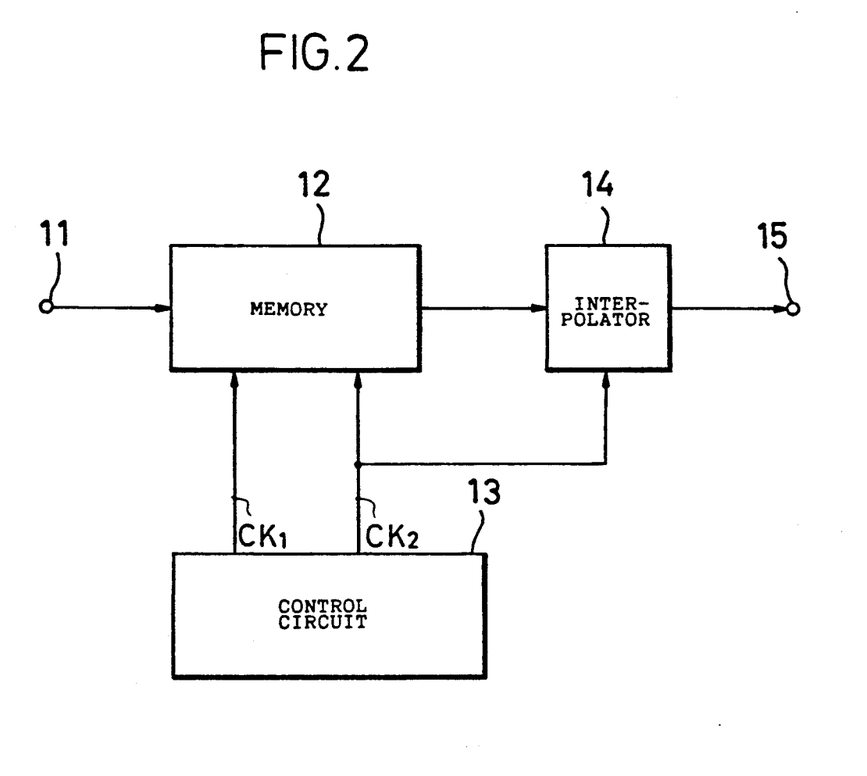
FIG. 2 is a circuit diagram used for performing the process of FIG. 1.

The signal input from the input terminal 11 as shown in FIG. 1A is written into the memory 12 according to the write clock CK1 that is output from the control circuit 13. This data written into the memory 12 is read out according to the read clock CK2 that is output from the control circuit 13.

Figure 1D:
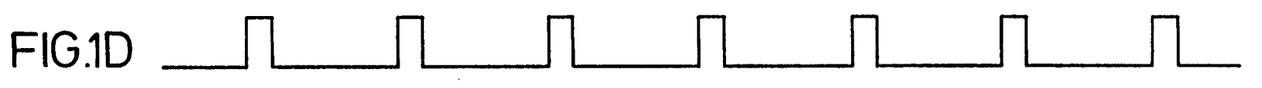

The write clock CK1 has the same frequency as that of the sampling clock shown in FIG. 1D. On the other hand, the read clock CK2 has the same frequency as that of the write clock CK1 but is a discontinued pulse train which lacks pulses once every four cycles.

Figure 1E:
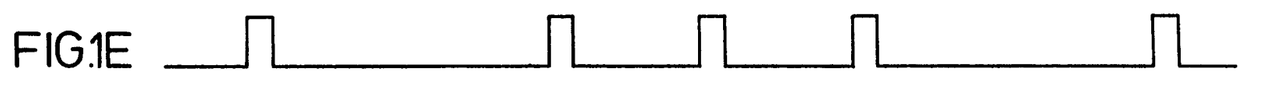
Figure 1F:
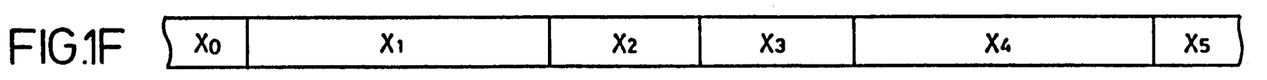

The data x read from the memory 12 by the read clock CK2 shown in FIG. 1E becomes as shown in FIG. 1F. The interpolator 14 at the output side to which this data x is supplied has a register which is operated by the same clock as the read clock CK2. Output of this register is shown in FIG. 1G.

Figure 1G:
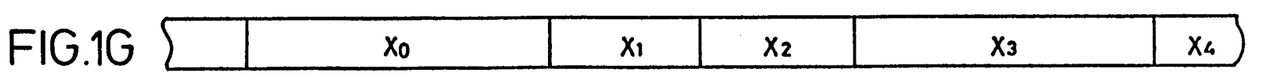

By performing the interpolation shown in FIG. 1C using the adjacent sampling data shown in FIGS. 1F and 1G, the interpolator 14 outputs the digital data having the same sampling period as that of the input digital signal and the time base extended to 4/3 times to the output terminal 15.

According to the conventional equipment described above, the time base of an input digital signal can be converted using a clock of a single frequency without changing the sampling period.

However, the following problems are found in the conventional equipment.

First, in case of the conventional equipment, sufficient frequency characteristic is not obtainable. That is, in case of the conventional equipment, the interpolation is performed using two adjacent sampling data. Therefore, it is considered that the interpolator operates as a low-pass filter composed of two taps (hereinafter referred to as LPF) in the conventional equipment.

However, the frequency characteristic of an LPF in two tap structure has a very gentle-sloping attenuation characteristic. Therefore, this LPF in two tap structure has a problem that the high-pass frequency even in the passing band is attenuated.

For instance, when the time base conversion of TV signal having a 4 MHz band is considered, 14.3 MHz is often adopted as sampling frequency. In this case, if the interpolating sample position is just at the middle point of the input sample position, gain A of LPF in two tap structure will become as shown by the following expression;

$$A = [(1 + \cos 2\pi f \cdot (\frac{1}{f_{sc}})/2]^{\frac{1}{2}}$$

where, Fsc represents the color subcarrier frequency.

When the gain A is expressed as shown above, if f=4 MHz, the gain A drops to 0.816 (1.8 dB). Therefore, if the time base of the TV signal is converted by the conventional equipment, image definition drops.

Further, in case of LPF in two tap structure, as the frequency characteristic is not of phase linear type, unnecessary ringing is generated. Therefore, it is not desirable for image quality to use the conventional equipment for the time base conversion of TV signal.

Further, to perform the time base conversion while keeping the signal band flat, it is necessary to make the interpolator in multiple tap structure. However, the conventional equipment is in such structure that the time base conversion is made using adjacent sampling data, it is not feasible to make the interpolator in multiple tap structure.

In addition, in case of the conventional equipment, if a low-speed operating dynamic memory which is advantageous from the viewpoint of cost is used, a circuit for converting serial data into parallel data is needed.

However, the operating speed of dynamic memory is slow.

In the conventional equipment, however, the memory must be drive at the input digital signal sampling period. Therefore, if this sampling period is short, the memory must be driven at an extremely fast speed and a speed conversion circuit becomes additionally necessary.

Further, in the case of the conventional equipment, it is necessary to provide a first interpolator for the time base compression and a second for the time base expansion, separately.

As described above, the conventional time base conversion apparatus has such problems that sufficient frequency characteristic cannot be obtained, a new data rate conversion circuit becomes necessary when a dynamic memory is used, and it is necessary to provide an interpolating filter for the time base compression and the time base expansion, respectively.

SUMMARY OF THE INVENTION

It is, therefore, an object of the present invention to provide a time base conversion circuit which is capable of obtaining a sufficient frequency characteristic.

Another object of the present invention is to provide a time base conversion apparatus which performs a time base conversion without causing data to be dropped.

A further object of the present invention is to provide a time base conversion apparatus which does not require a new data rate conversion circuit even when a dynamic memory is used, and is able to use the same interpolating filters for the time base compression and the time base expansion.

In order to achieve the above object, a time base conversion circuit according to one aspect of the present invention includes a data interpolating circuit for converting a digital signal of sampling frequency fs into a digital signal having M (M is a positive integer) samples per N/fs (N is another positive integer) cycle without loosing data during the interpolating process, a register for holding M data which are output from the data interpolating circuit at the cycle of N/fs, M memories for storing M data which are held by the register at the cycle of N/fs, a controller for controlling data write/read operations of the memories at the cycle of M/fs and a selector for selecting M data read from the memories by the controller successively at the cycle of 1/fs.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The present invention will be described in detail with reference to the FIGS. 3 through 8. Throughout the drawings, the same or equivalent reference numerals or letters will be used to designate like or equivalent elements for simplicity of explanation.

Figure 3:
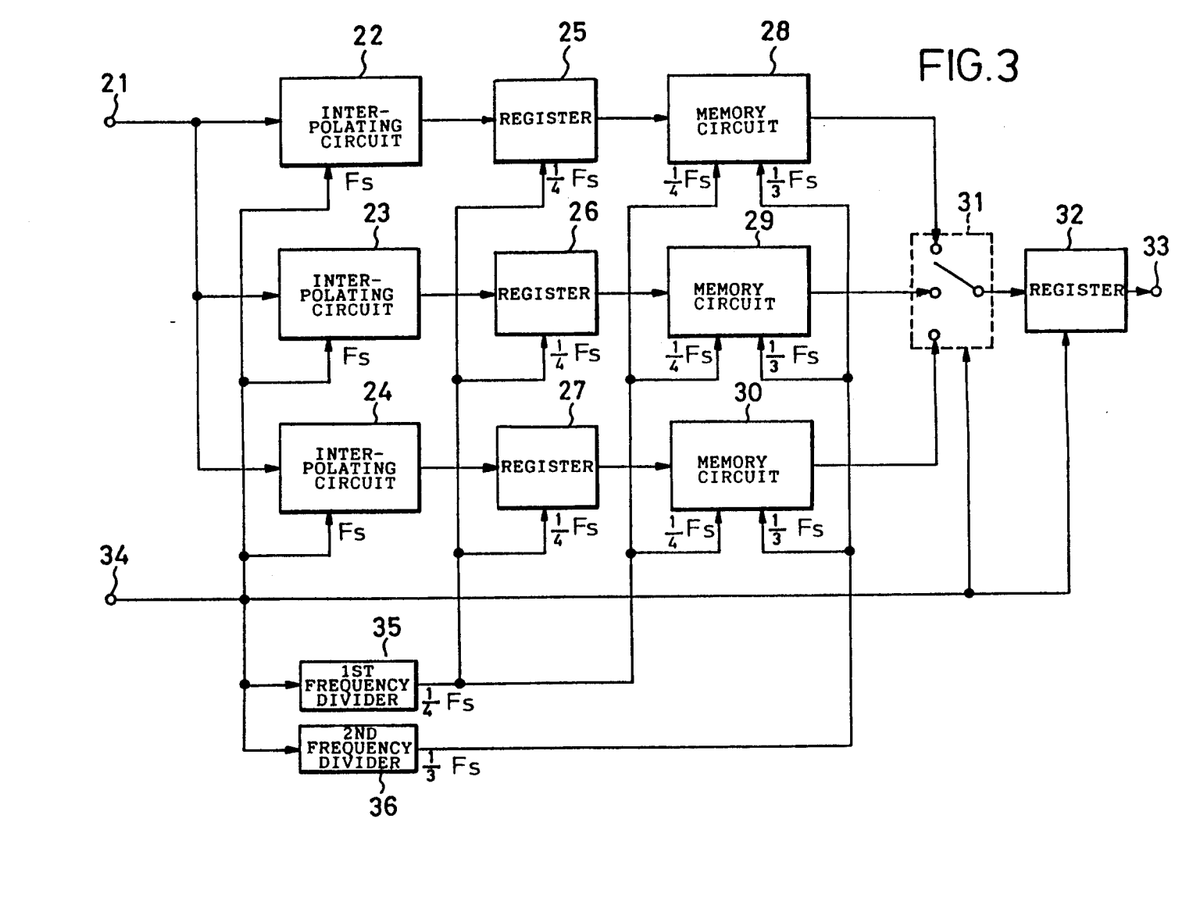
FIG. 3 is a circuit diagram showing an embodiment of the time base conversion according to the present invention.

FIG. 3 is a circuit diagram showing a first embodiment of the time base conversion apparatus according to the present invention. FIG. 3 shows the configuration in which the time base of an input digital signal is compressed to $\frac{3}{4}$ times.

In FIG. 3, an input digital signal with a sampling frequency Fs is input into the input terminal 21. This input digital signal is supplied in parallel to three interpolating filters 22, 23 and 24. Each of the interpolating filters 22, 23 and 24 performs a predetermined interpolation of data according to a master clock with the frequency Fs.

Interpolated data thus output from the interpolating filters 22, 23 and 24 are held in registers 25, 26 and 27, respectively. These registers 25, 26 and 27 operate under the control of a first clock with the frequency $(\frac{1}{4})$·fs. The first clock is supplied from a first frequency divider 35 which divides the frequency fs of the master clock by the factor [4].

The interpolated data held in the registers 25, 26 and 27 are written into memory circuits 28, 29 and 30. The writing operations of the memory circuits 28, 29 and 30 are carried out under the control of the first clock.

The interpolated data stored in the memory circuits 28, 29 and 30 are read out under the control of a second clock with the frequency $(\frac{1}{3})$·fs. The second clock is supplied from a second frequency divider 36 which divides the frequency fs of the master clock by the factor [3].

The interpolated data read out from the memory circuits 28, 29 and 30 are cyclically selected by a switch 31. The cyclical selecting operation of the switch 31 is carried out under the control of the master clock with the frequency fs.

The operation in the first embodiment will now be described below in reference to FIGS. 4A to 4E.

Figure 4A:
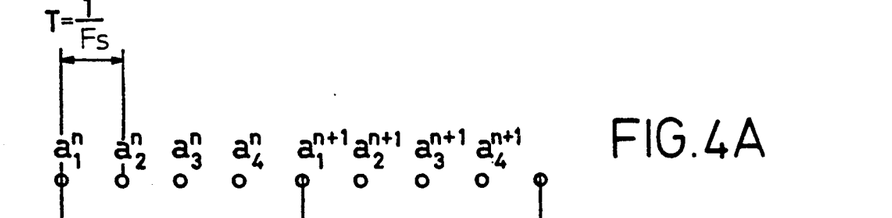
FIGS. 4A to 4E are diagrams for illustrating the operation of the circuit of FIG. 3.

FIG. 4A shows the input digital signal in a form of data train {a}. In FIG. 4A, the data train {a} of the input digital signal comprises a series of samples; a1n, a2n, a3n, a4n. The data train {a} are sampled with the master clock, as described before. Thus, data train {a} has a period T of 1/fs, i.e., T=1/fs.

This input signal series {a} are converted into the signal series of three samples for every four samples by the interpolating filters 22, 23 and 24. That is, they are converted into the signal series of three samples for every 4T. The upper subscript "n" of the input signal series {a}, above denotes the "n"th cycle in this interpolating process cycle and the lower subscripts "1", "2", "3" and "4" denote sample order in each cycle.

Figure 4B:
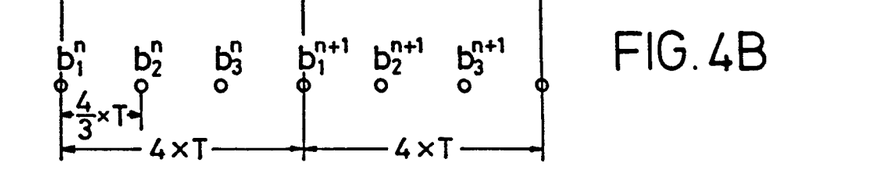
Figure 4C:
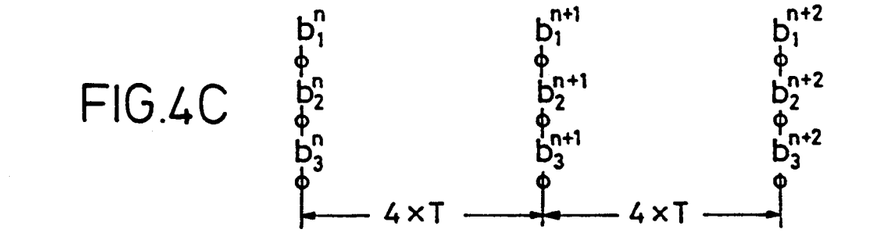

FIG. 4B shows the interpolated signal in a form of data train {b}. In FIG. 4B, the data train {b} of the interpolated signal comprises a series of samples; b1n, b2n, b3n. The data train {b} has a sampling period of (4/3). T.

Now, the generation of the signal series {b} by the interpolating process is explained by taking three data b1n, b2n and b3n at the "n"th cycle as the typical examples.

These 3 data b1n, b2n and b3n are generated by the interpolating filters 22, 23 and 24.

Figure 5:
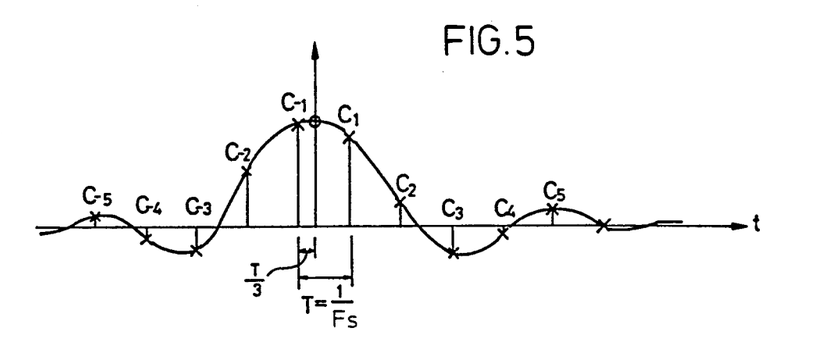
FIG. 5 is a diagram for illustrating the response characteristic of the interpolating filters of FIG. 3.
Figure 6:
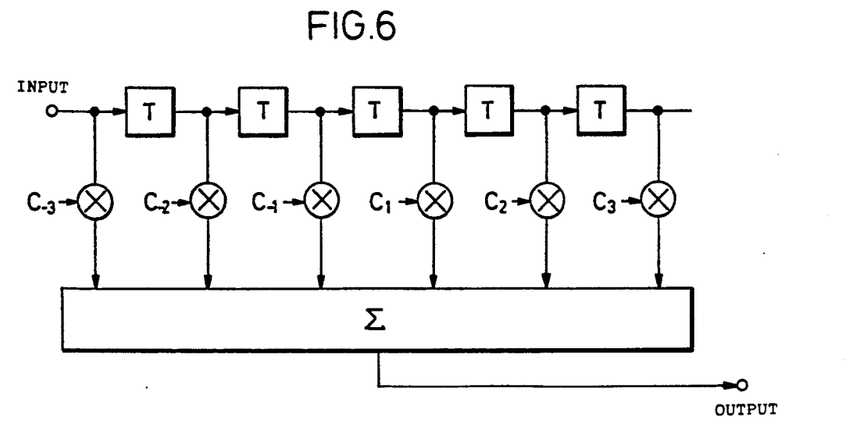
FIG. 6 is an illustrative circuit diagram showing the interpolating filters in FIG. 3.

Data b2n out of these three data is positioned at a location delayed from a2n by T/3 period (T=1/fs). Therefore, the interpolating filter 23 producing this data b2n can be composed using a proper impulse response, as shown in FIG. 5. That is, when the time base of this impulse response is shifted by T/3 period, and making the series obtained by sampling its characteristic at intervals of T as {c}, the interpolating filter 23 can be implemented with a multiple tap filter, as shown in FIG. 6.

As to the interpolating filter 24 producing data b3n, a multiple tap filter having proper coefficient can be constructed in the same manner.

As to the interpolating filter 22 producing data b1n, because the positions of b1n and a1n agree with each other in FIGS. 4A and 4B, it is not necessary to construct a multiple tap filter. That is, a construction to output a1n directly as b1n is sufficient.

Figure 7:
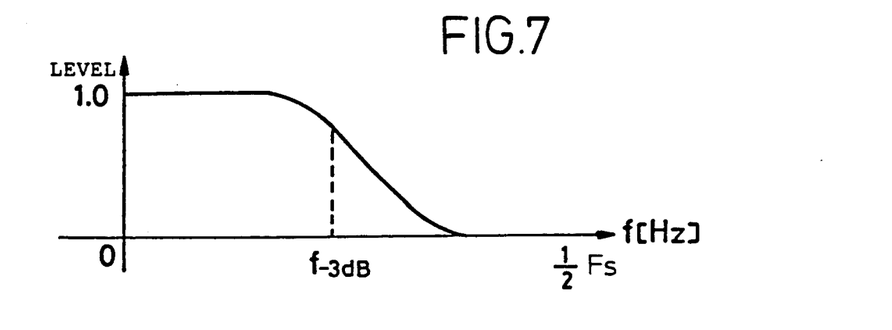
FIG. 7 is a diagram for illustrating the response characteristics of the circuit of FIG. 3 in the form of the Fourier transformation.

FIG. 7 is a characteristic diagram showing the characteristic of the impulse response of FIG. 5 in the form of the Fourier transformation.

To make the cut-off of the characteristic curve in FIG. 7 sharp, it is necessary to make the tail of the impulse response long and increase the number of taps of the filter shown in FIG. 6. In this case, because the number of filter taps can be set as desired, it is possible to cope with the increasing sharpness of characteristic.

By the interpolation described above, the input signal series {a} having four samples per 4T period is converted into the signal series {b} having three samples per 4T period without loosing data.

Data b1n, b2n and b3n at the "n"th cycle produced by the interpolating filters 22, 23 and 24 are supplied to the registers 25, 26 and 27, respectively and held according to the clock of frequency fs/4 which is output from the frequency division circuit 35. Data b1n, b2n and b3n are thus positioned at the time position shown in FIG. 4C.

Figure 4D:
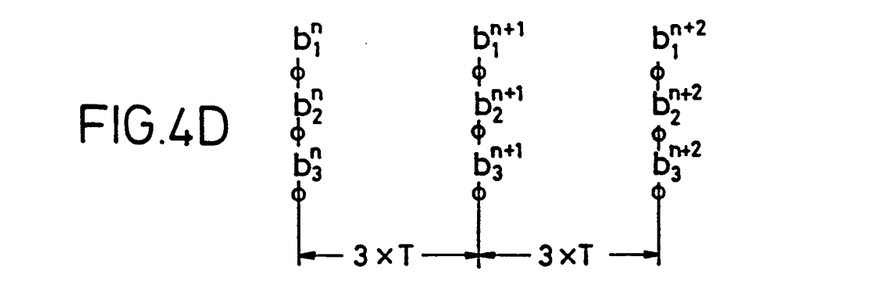

Data output from the registers 25, 26 and 27 are written into the memories 28, 29 and 30 according to the clock of frequency fs/4 which is output from the frequency division circuit 35. The data written into these memories 28, 29 and 30 are read out according to the frequency fs/3 which is output from the frequency division circuit 36 and become the data as shown in FIG. 4D. As clearly seen from FIGS. 4C and 4D, the data are compressed to a time of ¾ times through the write and read processings of the memory circuits 28, 29 and 30.

The data output from the memory circuits 28, 29 and 30 are selected successively by the switch 31 according to the clock of frequency fs which is input from the terminal 34. As a result, data b1n, b2n and b3n are converted into series data of sampling period T.

These series converted data b1n, b2n and b3n are held in the register 32 according to the clock of above frequency fs.

Figure 4E:
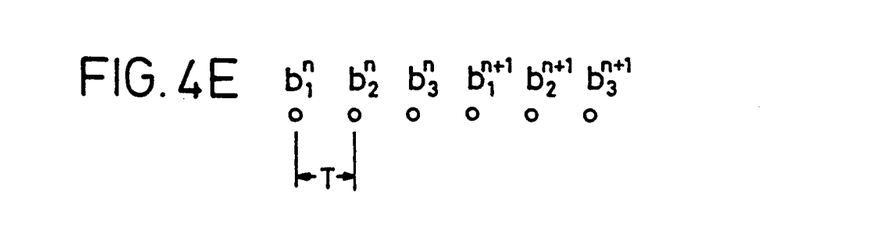

Hereafter, data at the "n+1"th cycle, "n+2"th cycle ... are processed entirely in the same manner. Thus, a digital signal having the same sampling period as the sampling period T of the input digital signal and the timer axis compressed to ¾ times is obtained at the output terminal 33 as shown in FIG. 4E. When this compression is explained at, for instance, the "n"th cycle, the time width at the "n"th cycle is the interval of 4T in case of the input digital signal shown in FIG. 4A but it is compressed to the interval of 3T in case of the output digital signal shown in FIG. 4E.

Figure 8:
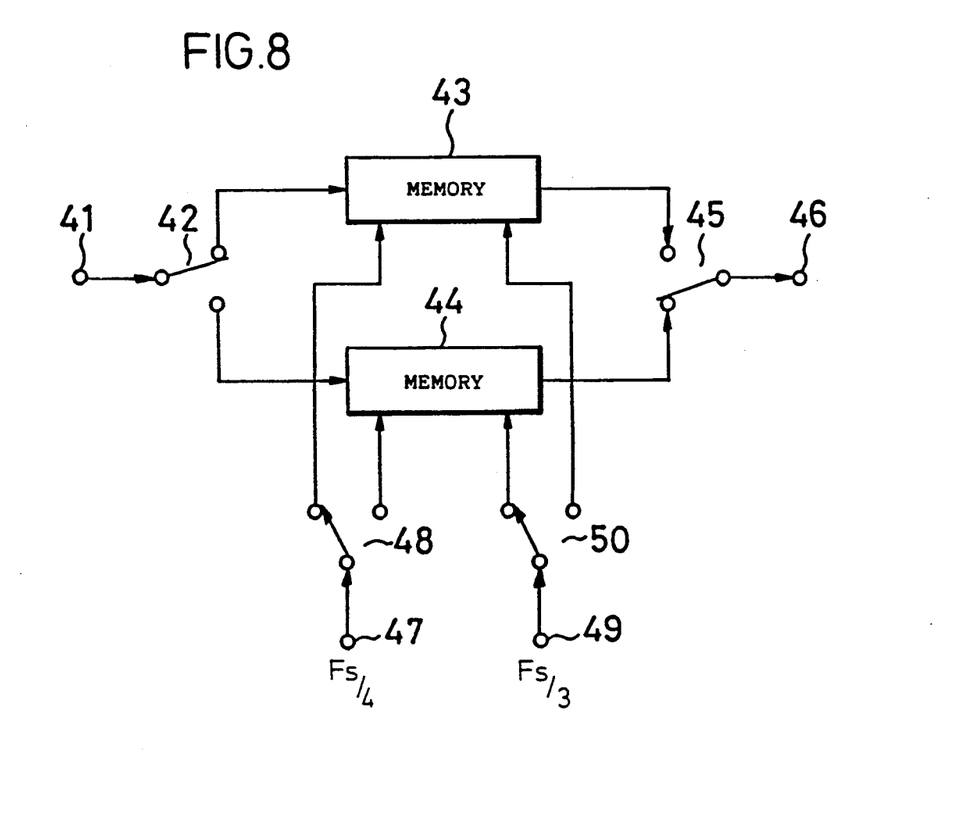
FIG. 8 is a illustrating circuit diagram of the memory circuits of FIG. 3.

FIG. 8 is a circuit diagram showing one example of the definite construction of the memory circuits 28, 29 and 30.

In this diagram, write data which are input from the input terminal 41 are supplied to the memories 43 and 44 alternately through the switch 41 at every period of 4T.

In the cycle with 4T intervals, the switches 42, 45, 48 and 50 are kept closed in the direction shown in the diagram. Therefore, in this cycle, write data which are input from the input terminal 41 are supplied to the memory 43 through the switch 42. Then, they are written according to the clock of frequency fs/4 which is input to the memory 43 from the terminal 47 through the switch 48.

At the same time, the data stored in the memory 44 are read out according to the clock of frequency fs/3 which is input from the terminal 49. These read data are supplied to the output terminal 46 through the switch 45.

In the next cycle, the switches 42, 45, 48 and 50 are closed and the read operation is carried out in the memory 43 and the write operation is carried out in the memory 44.

Thus, in the memory circuits 28, 29 and 30, the continuous data write and read can be carried out simultaneously.

A case where the ¾ times time compression has been explained above. According to the construction shown in FIG. 3, the time expansion of 4/3 times also can be easily realized. That is, what is required is to change the number of interpolating filters, registers and memory circuits from three to four pieces, respectively, change the switch construction from the three terminal switch to the four terminal switch, use a clock of frequency fs/3 as a four register driving clock and memory circuit write clock, and use a clock of frequency fs/4 as a memory circuit read clock.

Further, what is needed to cope with the time base compression of ¾ times or the time base expansion of 4/3 times is to produce a suitable circuit which is capable of coping with the above-mentioned time base expansion of 4/3 times in advance and select a needed circuit or clock change-over according to the time base conversion mode.

According to the embodiment described above in detail, a desirable frequency characteristic is obtainable. This is because the number of samples of input digital signal is changed through the interpolation, and the time base of input digital signal is converted through the write/read processing of the signal to/from the memory circuits 28, 29 and 30. That is, according to such a construction as this, differing from the conventional time base conversion using adjacent sampling data, the number of taps of the interpolating filters 23 and 24 is not restricted to a particular number, such as two.

Further, according to this embodiment, it is unnecessary to provide a data rate conversion circuit separately even when the memories 43 and 44 are composed of dynamic memories. This is because the interpolating outputs are supplied to the memory circuits 28, 29 and 30 after holding in the registers 25, 26 and 27 at every interpolating cycle 4T. That is, it is because the memories 43 and 44 can be driven at a period longer than the sampling period T of the input digital signal in this construction.

Further, according to this embodiment, it is not necessary to provide an interpolating filter separately for the time base compression and for the time base expansion. This is because the time base conversion is made in the sequence of conversion of the number of samples and the time base conversion. That is, it becomes possible to perform the time base conversion process in the same sequence either for the time base compression or expansion.

In the present invention as described above, an input digital signal having N samples (N is a positive integer) per N/fs cycle is converted into digital signal having M samples (M is another positive integer) per N/fs cycle through the interpolation. Because the memory write cycle and read cycle are N/fs and M/fs, respectively, these M data are subject to the time base conversion of M/N times by the memory write and read processings. Thus, digital signals having M samples per M/fs cycle are obtained. M data obtained at every M/fs cycle through this time base conversion are selected successively at every 1/fs cycle. Consequently, a digital signal whose sampling period is the same as that of the input digital signal and whose time base has been converted to M/N times is obtained.

As described above, according to the construction which changes the number of samples of input digital signal through the interpolation and converts the time base through the memory write and read processings, a desired frequency characteristic can be obtained because the number of taps on the interpolating filter is not limited.

Further, because the interpolating output is supplied to a memory at every N/fs cycle, the memory can be driven at a longer cycle than the input digital signal sampling period 1/fs. As a result, it becomes unnecessary to provide a data rate conversion circuit separately even when dynamic memories are used.

Furthermore, because the time base conversion is made in the sequence of conversion of the number of samples and then, conversion of the time base, it is possible to perform the conversion processing in the same sequence for both the time compression and extention. Thus, it is unnecessary to provide the interpolating filters separately for the time base compression and for the time base expansion.

One embodiment of the present invention has been explained above in detailed. The present invention is not limited to only the embodiment described above.

For instance, in the embodiment described above, a case where N is [3] or [4] and M is [4] or [3] has been explained. However, in the present invention, other values may be set for N and M.

Further, in the above embodiment a case where M interpolating filters has been explained. In this invention, however, one interpolating filter may be used in time sharing system of M times.

In addition, the present invention is applicable not only to a case where the time base of TV signals is converted in the horizontal direction but also to the time base conversion in the vertical direction. In this case, it is necessary to set the delay unit at the horizontal scanning period H. Further, it is understood that this invention is applicable to the time base conversion of electric signals other than TV signals.

Besides, it is also understood that the present invention can be applied by modifying in various ways in a range not deviating from its intended purpose.

As described above, according to the present invention, it is possible to provide a time base conversion apparatus which is capable of obtaining sufficient frequency characteristic and using the same interpolating filters for the time base compression and the time base expansion without requiring any data rate conversion circuit even when dynamic memories are used.

As described above, the present invention can provide an extremely preferable time base conversion circuit.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A time base conversion circuit comprising:
   at least one data interpolating means for converting a digital signal of sampling frequency fs into a digital signal having M (M is a positive integer greater than two) samples per N/fs (N is another positive integer) cycle without losing data during the interpolating process, each data interpolating means comprising a digital filter having at least three taps;
   data holding means for holding M data which are output from the data interpolating means at the cycle of N/fs;
   M storing means for storing M data which are held by the data holding means at the cycle of N/fs;
   controlling means for controlling data read operations of the M storing means at the cycle of M/fs; and
   selecting means for selecting M data read from the M storing means by the controlling means successively at the cycle of 1/fs.

2. A time base conversion circuit of claim 1, wherein when the time base is to be compressed, N>M, and when the time base is to be expanded, M>N.

3. A time base conversion circuit of claim 1, wherein M is equal to the number of data interpolating means.

4. A time base conversion apparatus for converting an input digital signal of sampling frequency fs and sampling period T=1/fs having N samples (N is a positive integer) per NT cycle into an output digital signal having M samples (M is a positive integer greater than two) per MT cycle, comprising:
- M interpolating means for generating M interpolated data from the input digital signal at a cycle of NT, at least one of the M interpolating means comprising a digital filter having at least three taps;
- routing means for routing the input digital signal to the M interpolating means; M holding means for holding the M interpolated data at a cycle of NT;
- M storing means for storing the M interpolated data from the M holding means at a cycle of NT;
- M reading means for reading the M interpolated data from the M storing means at a cycle of MT; and
- selecting means for selecting the M interpolated data from the M reading means at a cycle of T and for converting the M interpolated data into series data.

5. A time base conversion apparatus for generating a digital signal with the same sampling frequency fs and sampling period $T=1/fs$, as the input digital signal and with a time base changed by a factor of M/N (M and N are integers), comprising:
- M interpolating means for generating M interpolated data from the input digital signal at a cycle of NT, at least one of the M interpolating means comprising a digital filter having at least three taps;
- routing means for routing the input digital signal to the M interpolating means; M holding means for holding the M interpolated data at a cycle of NT;
- M storing means for storing the M interpolated data from the M holding means at a cycle of NT;
- M reading means for reading the M interpolated data from the M storing means at a cycle of MT; and
- selecting means for selecting the M interpolated data from the M reading means at a cycle of T and for converting the M interpolated data into series data.

* * * * *

UNITED STATES PATENT AND TRADEMARK OFFICE
CERTIFICATE OF CORRECTION

PATENT NO. : 5,153,845
DATED : October 06, 1992
INVENTOR(S) : Ogawa, et al

It is certified that error appears in the above-identified patent and that said Letters Patent is hereby corrected as shown below:

Front Page, Abstract, line 5, change "loosing" to --losing--.

Front Page, Abstract, line 9, change "and" to --a--.

Front Page, Abstract, line 11, change "selecter" to --selector--.

Front Page, Abstract, line 12, change "successivly" to --successively--.

Signed and Sealed this

Twenty-fifth Day of January, 1994

Attest:

BRUCE LEHMAN

*Attesting Officer*      *Commissioner of Patents and Trademarks*